United States Patent
Chen et al.

(10) Patent No.: US 6,964,581 B2
(45) Date of Patent: Nov. 15, 2005

(54) MOUNTING APPARATUS FOR CIRCUIT BOARD

(75) Inventors: Hsuan-Tsung Chen, Tu-Chen (TW); Pin-Shian Wu, Tu-Chen (TW)

(73) Assignee: Hon Hai Precision Ind. Co., LTD, Taipei Hsien (TW)

( * ) Notice: Subject to any disclaimer, the term of this patent is extended or adjusted under 35 U.S.C. 154(b) by 0 days.

(21) Appl. No.: 10/982,424

(22) Filed: Nov. 5, 2004

(65) Prior Publication Data

US 2005/0106936 A1  May 19, 2005

(30) Foreign Application Priority Data

Nov. 18, 2003  (TW) ........................... 92220367 U

(51) Int. Cl.[7] .............................................. H01R 13/73
(52) U.S. Cl. ............. 439/547; 174/138 D; 174/138 G; 361/759
(58) Field of Search ................ 439/547; 174/52.1, 174/138 D, 138 G; 361/758–759

(56) References Cited

U.S. PATENT DOCUMENTS

| | | | | |
|---|---|---|---|---|
| 5,124,888 A | * | 6/1992 | Suzuki et al. ............... 361/740 |
| 5,285,353 A | * | 2/1994 | Buck et al. .................. 361/732 |
| 5,373,104 A | * | 12/1994 | Brauer ....................... 174/52.1 |
| 5,548,483 A | * | 8/1996 | Feldman ..................... 361/737 |
| 5,552,961 A | * | 9/1996 | Van Gaal et al. ............ 361/700 |
| 5,706,173 A | * | 1/1998 | Carney et al. ............... 361/740 |
| 5,973,926 A | * | 10/1999 | Sacherman et al. ......... 361/759 |
| 5,978,232 A | * | 11/1999 | Jo .............................. 361/796 |
| 6,118,668 A | * | 9/2000 | Scholder et al. ............ 361/753 |
| 6,166,917 A | * | 12/2000 | Anderson .................... 361/756 |
| 6,362,978 B1 | * | 3/2002 | Boe ............................ 361/825 |
| 6,424,538 B1 | * | 7/2002 | Paquin ........................ 361/752 |
| 6,424,540 B1 | * | 7/2002 | Chen et al. .................. 361/759 |
| 6,445,588 B1 | * | 9/2002 | Masterton et al. .......... 361/759 |
| 6,608,759 B1 | * | 8/2003 | Barringer et al. ........... 361/759 |
| 6,695,629 B1 | * | 2/2004 | Mayer ......................... 439/92 |
| 6,761,273 B1 | * | 7/2004 | Chen et al. .................. 211/41.17 |
| 6,781,055 B2 | * | 8/2004 | Chen ........................... 174/52.1 |
| 6,791,843 B1 | * | 9/2004 | Dobbs et al. ................ 361/758 |
| 6,798,669 B1 | * | 9/2004 | Hsu ............................ 361/801 |
| 6,813,165 B2 | * | 11/2004 | Cheng et al. ................ 361/801 |
| 6,816,384 B2 | * | 11/2004 | Wu et al. ..................... 361/759 |
| 6,834,766 B2 | * | 12/2004 | Lin et al. ..................... 211/41.17 |
| 6,864,573 B2 | * | 3/2005 | Robertson et al. .......... 257/718 |
| 6,894,217 B2 | * | 5/2005 | Li .............................. 174/35 R |
| 2003/0067753 A1 | * | 4/2003 | Kao ............................ 361/759 |
| 2004/0120126 A1 | * | 6/2004 | Chen .......................... 361/759 |
| 2004/0125576 A1 | * | 7/2004 | Lin et al. ..................... 361/759 |

FOREIGN PATENT DOCUMENTS

TW          551026        9/2003

* cited by examiner

Primary Examiner—Tho D. Ta
Assistant Examiner—Larisa Tsukerman
(74) Attorney, Agent, or Firm—Wei Te Chung

(57) ABSTRACT

A mounting apparatus for a circuit board (10) comprises a support plate (50), a tray (20) and a clip (40). The support plate includes a plurality of catches (52) and two locking holes (56). The tray for positioning the circuit board thereon defines a plurality of catch apertures (26). The tray includes a bent plate (22) extending upwardly from a rear side. The clip is pivotally mounted to the tray. The clip includes a locking portion (42) having two protrusions (422), and an operation portion (46) having two resilient fingers (462) pressing the bent plate. In assembly, the catches of the support plate slidably engage in the catch apertures of the tray, the protrusions of the clip extend in the locking hole of the support plate to secure the circuit board to the support plate.

14 Claims, 5 Drawing Sheets

US 6,964,581 B2

MOUNTING APPARATUS FOR CIRCUIT BOARD

BACKGROUND OF THE INVENTION

1. Field of the Invention

The present invention relates to mounting apparatuses, and particularly to a mounting apparatus for readily and securely mounting a circuit board therein.

2. Description of the Related Art

During assembly of a typical personal computer, a circuit board must be fastened to a computer frame or chassis. The circuit board is conventionally mounted to the computer chassis using fasteners such as screws or bolts. However, when installing or removing the circuit board, using the fasteners is laborious and time-consuming. In addition, a tool such as a screwdriver or wrench is usually required. Moreover, the circuit board is prone to be damaged if the tool slips during manipulation of the fasteners.

Taiwan Pat. No. 551,026 discloses a mounting apparatus for a circuit board. The circuit board is firstly secured to a tray using fasteners such as clips. The clips engage in corresponding through holes of the tray to secure the circuit board thereon. Then the combined circuit board and tray is mounted to a computer chassis. A tool is not required when using the clips. However, the using of the clips increases the cost of the manufacture. Because the clips are not conventional components, it is inconvenient when some clips destroyed or missing.

Thus, an improved mounting apparatus for circuit boards which overcomes the above-mentioned problems is desired.

BRIEF SUMMARY OF THE INVENTION

Accordingly, an object of the present invention is to provide a mounting apparatus for readily and securely installing and removing a circuit boards to and from equipment such as a chassis of a computer.

To achieve the above object, the mounting apparatus for a circuit board of the present invention comprises a support plate, a tray and a clip. The support plate includes a plurality of catches and two locking holes. The tray for positioning the circuit board thereon defines a plurality of catch apertures. The tray includes a bent plate extending upwardly from a rear side. The clip is pivotally mounted to the tray. The clip includes a locking portion having two protrusions, and an operation portion having two resilient fingers pressing the bent plate. In assembly, the catches of the support plate slidably engage in the catch apertures of the tray, the protrusions of the clip extend in the locking hole of the support plate to secure the circuit board to the support plate.

Other objects, advantages and novel features of the present invention will become more apparent from the following detailed description when taken in conjunction with the accompanying drawings, in which:

DETAILED DESCRIPTION OF THE INVENTION

Figure 1:
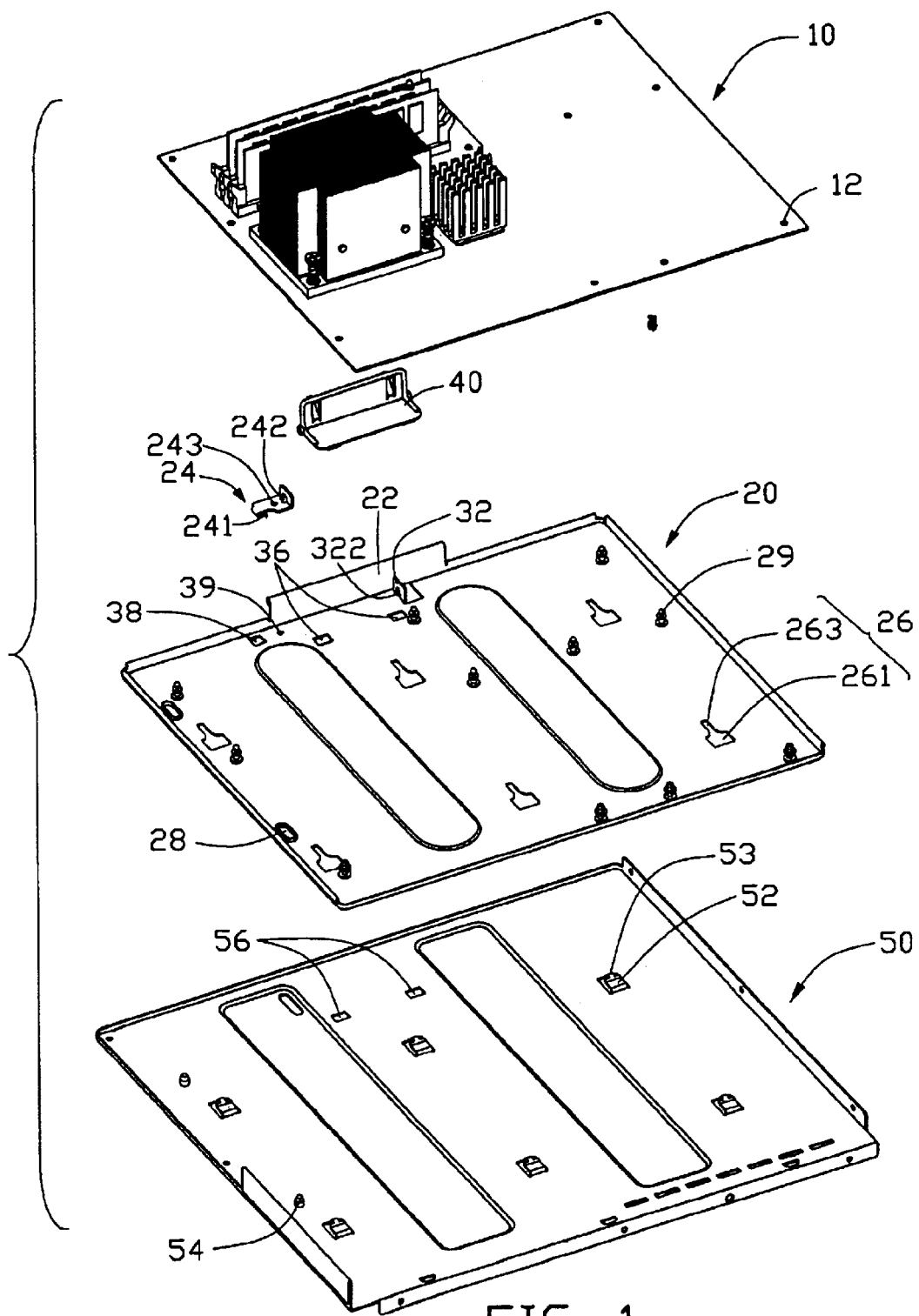
FIG. 1 is an exploded, isometric view of a motherboard mounting apparatus in accordance with the preferred embodiment of the present invention, together with a circuit board, the mounting apparatus comprising a tray, a clip, a fixing means and a support plate.
Figure 2:
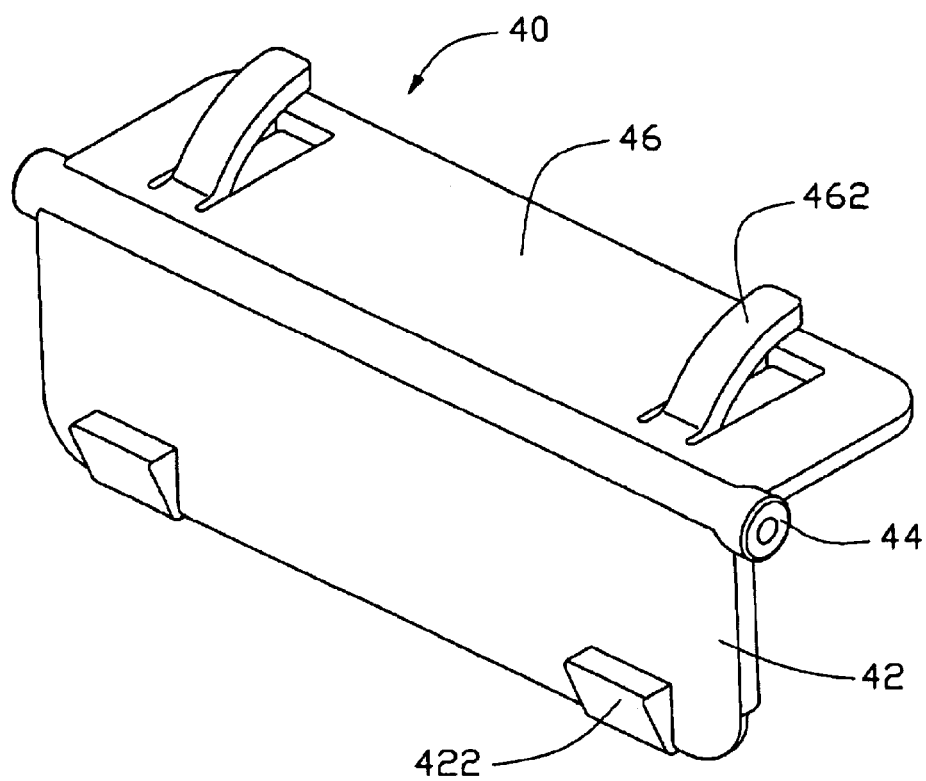
FIG. 2 is an isometric view of the clip of FIG. 1, but viewed from another aspect.

Referring to FIGS. 1 and 2, a mounting apparatus in accordance with the preferred embodiment of the present invention is used to accommodate a circuit board 10 therein. A plurality of through holes 12 is defined in the circuit board 10. The mounting apparatus comprises a tray 20, a fixing means 24, a clip 40 and a support plate 50. The support plate 50 is to be attached to a panel of a computer chassis (not shown).

The support plate 50 comprises a plurality of spaced catches 52 which is stamped upwardly from it. Each catch 52 comprises a generally horizontal portion, and a neck 53 connecting between the horizontal portion and the support plate 50. A pair of guiding posts 54 protrudes from the support plate 50 at one side. A pair of locking holes 56 is defined at a rear side of the support plate 50.

The tray 20 comprises a bent plate 22 extending upwardly from a rear edge thereof. A plurality of standoffs 29 protrudes from the tray 20, corresponding to the through holes 12 of the circuit board 10. A plurality of catch apertures 26 is defined in the tray 20, corresponding to the catches 52 of the support plate 50. Each catch aperture 26 comprises a wide guiding part 261 and a narrow locking part 263 toward the bent plate 22 and in communication with the guiding part 261. A pair of guiding slots 28 is defined in the tray 20, corresponding to the guiding posts 54 of the support plate 50. A pair of through apertures 36 is defined in the tray 20 adjacent to the bent plate 22, corresponding to the locking holes 56 of the support plate 50. A tab 32 is stamped upwardly from the tray 20 between the bent plate 22 and one through apertures 36. The tab 32 defines a pivot hole 322. A retaining hole 38 and a screw hole 39 are defined in the tray 20 between the bent plate 22 and the other through apertures 36.

The clip 40 has a generally L shape. The clip 40 comprises a locking portion 42, an operation portion 46, and an axis 44 connecting the locking portion 42 and the operation portion 46. A pair of protrusions 422 protrudes downwardly from a front portion of the locking portion 42, corresponding to the locking holes 56 of the support plate 50, and the through aperture 36 of the tray 20. A pair of resilient fingers 462 is stamped outwardly from the operation portion 46.

The fixing means 24 has a horizontal part and a vertical part. A splint 241 is bent from a distal end of the horizontal part at 180 degree. A screw hole 243 is defined in the horizontal part, corresponding to the screw hole 39 of the tray 20. A pivot hole 242 is defined in the vertical part, corresponding to the pivot hole 322 of the tray 20.

Figure 3:
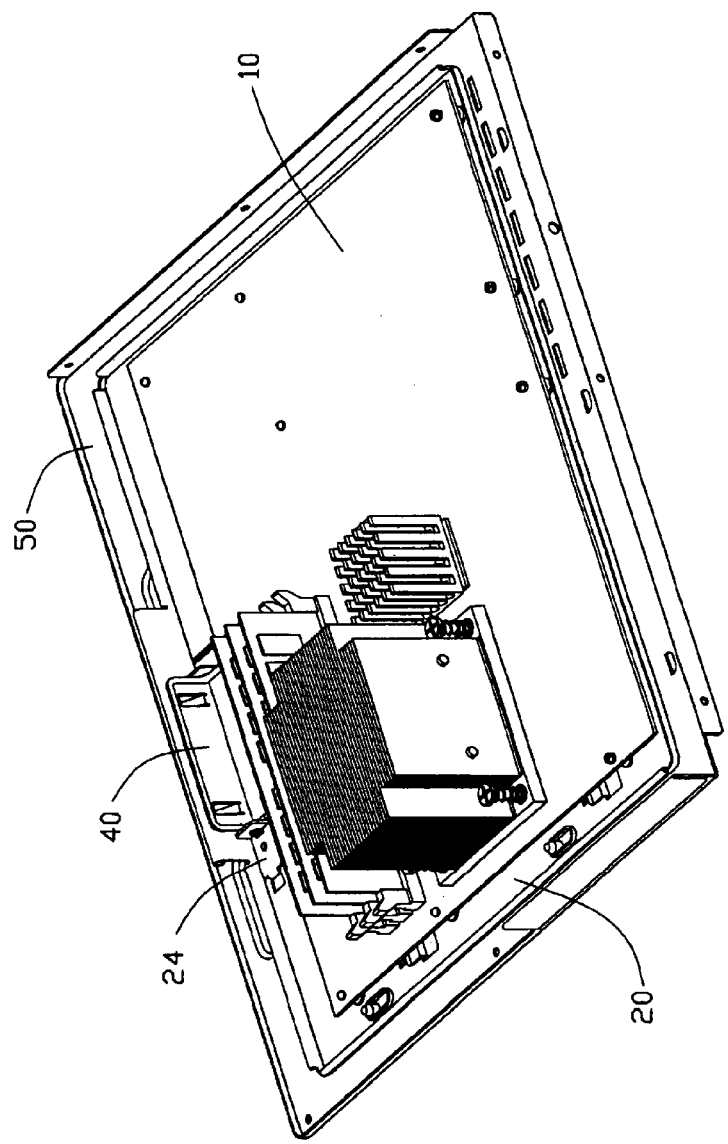
FIG. 3 is an assembled view of FIG. 1.
Figure 4:
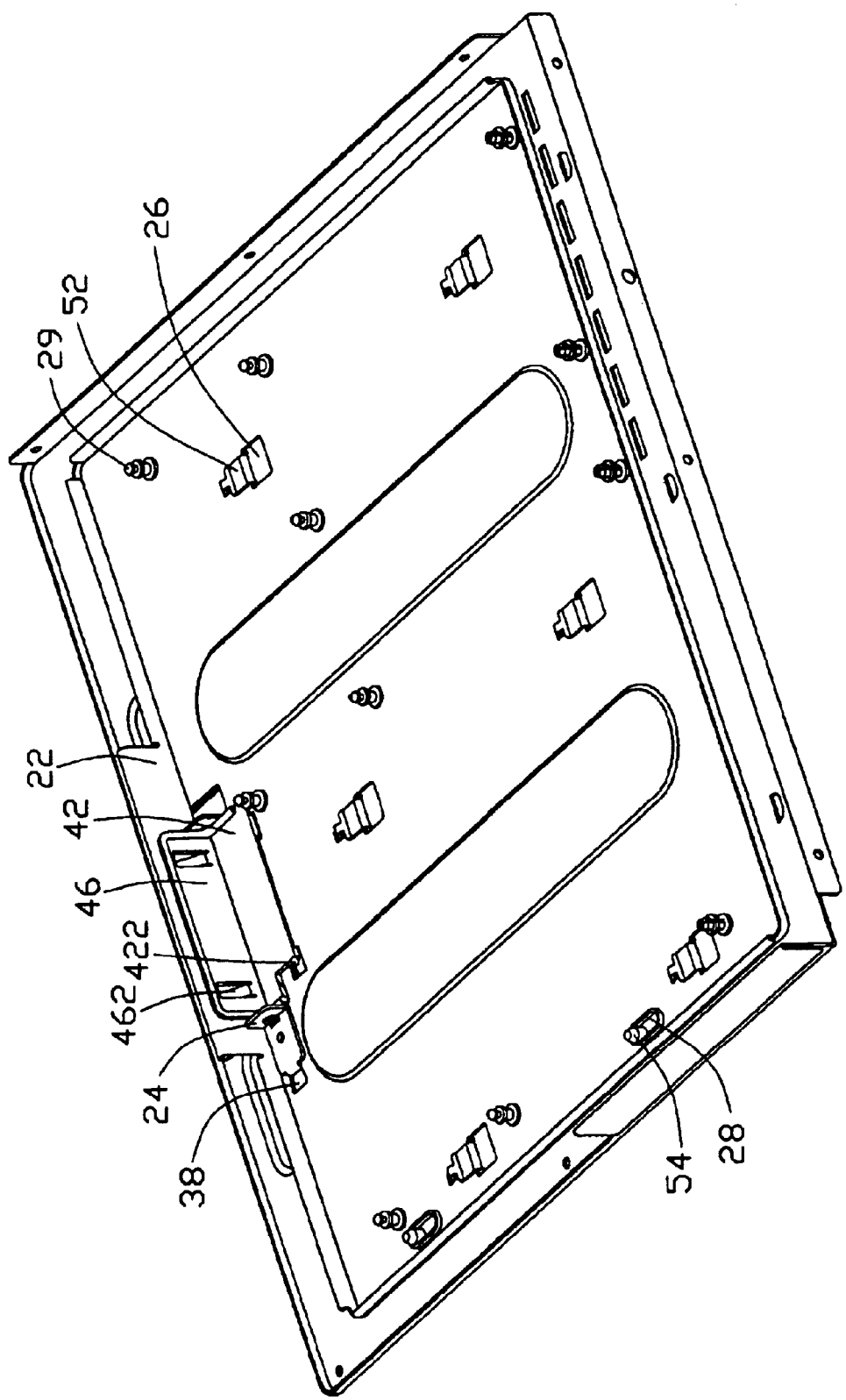
FIG. 4 is similar to FIG. 3 without the circuit board, with the tray in a locked position.
Figure 5:
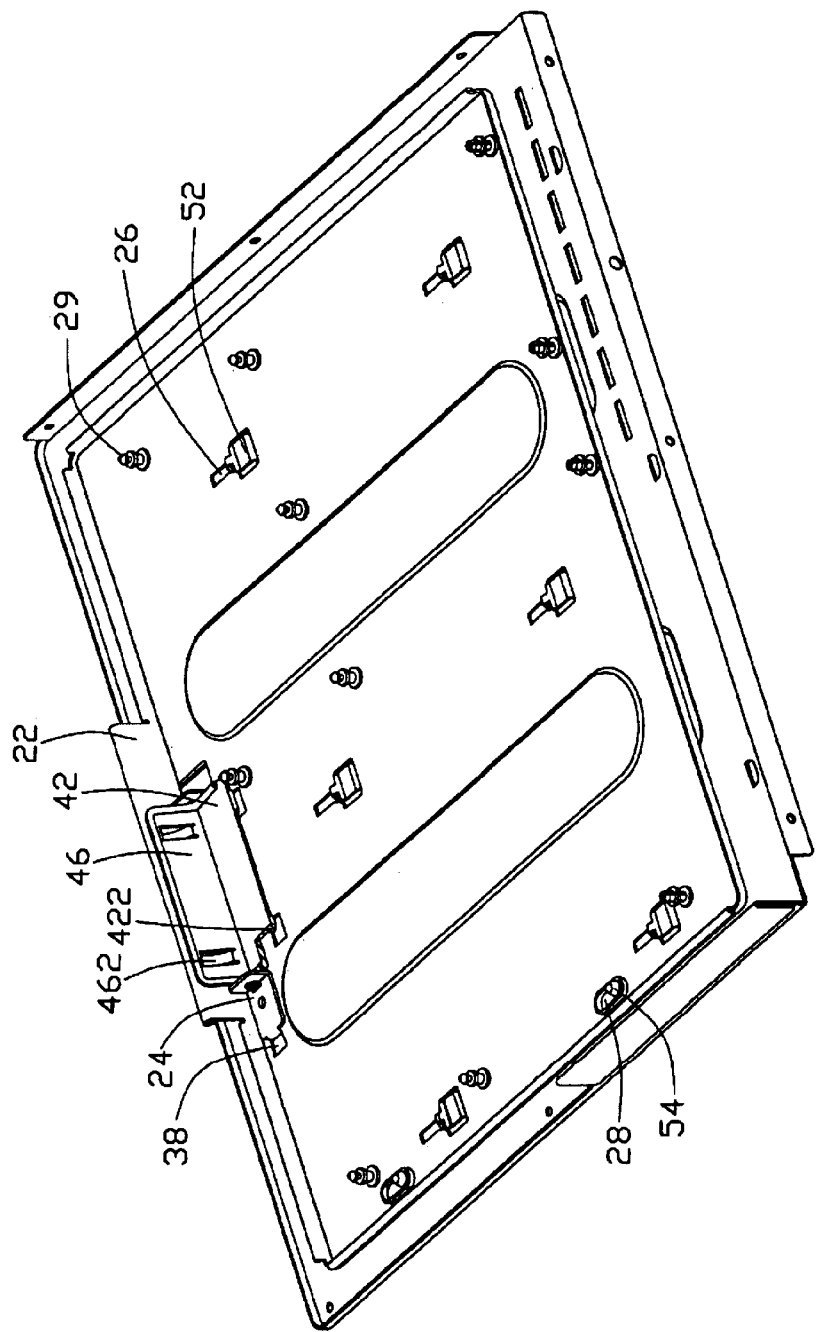
FIG. 5 is similar to FIG. 3 without the circuit board, with the tray in an unlocked position.

Referring to FIGS. 3–5, when assembling the clip 40 and the fixing means 24 to the tray 20, one end of the axis 44 of the clip 40 is inserted in the pivot hole 322 of the tray 20. The protrusions 422 of the clip 40 extend through the through aperture 36 of the tray 20. The splint 241 of the fixing means 24 extends through the retaining hole 38 of the tray 20 and clips the tray 20, with the pivot hole 242 receiving the other end of the axis 44 of the clip 40. A screw (not shown) extends through the screw hole 243 of the fixing means 24 and engages in the screw hole 39 of the tray 20. The tray 20, the fixing means 24 and the clip 40 are assembled together. Meanwhile, the resilient fingers 462 of the clip 40 are elastically pressing on the bent plate 22 of the tray 20.

When assembling the circuit board 10 to the tray 20, the standoffs 29 of the tray 20 extends through the corresponding through holes 12 of the circuit board 10 and engage therein. Thus, the circuit board 10 is assembled to the tray 20.

The combined circuit board 10, tray 20, fixing means 24 and clip 40 is placed on the support plate 50. The catches 52 of the support plate 50 are extended into the guiding parts 261 of the catch apertures 26 of the tray 20. The bent plate 22 of the tray 20 is pushed forwardly, so that the necks 53 of the catches 52 are slid into the locking parts 263 of the catch apertures 26 respectively. The protrusions 422 of the clip 40 are engaged snappingly in the locking holes 56 of the support plate 50 respectively. Thus, the circuit board 10 is secured in the chassis.

To remove the circuit board 10 from the chassis, the clip 40 pivots toward the bent plate 22 around the axis 44 by pushing the operation portion 46, with the resilient fingers 462 being elastically compressed. The protrusions 422 are withdrawn from the locking holes 56 of the support plate 50 respectively. The bent plate 22 of the tray 20 is pushed backwardly to slide the necks 53 of the catches 52 of the support plate 50 from the locking parts 263 to the guiding part 261 of the catch apertures 26. The combined circuit board 10, tray 20, fixing means 24 and clip 40 is then easily removed from the chassis.

Alternatively, the tray 20 can be secured to the support plate 50 firstly, then the motherboard 10 is mounted to the tray 20. The catches 52 can be formed on the tray 20 and the catch apertures 26 can be defined in the support plate 50. In addition, the support plate 50 can be the panel of the chassis, that is, the catches 52, the guiding parts 54 and locking holes 56 can be directly formed at the panel of the chassis.

While the present invention has been illustrated by the description of the preferred embodiment thereof, and while the preferred embodiment has been described in considerable detail, it is not intended to restrict or in any way limit the scope of the appended claims to such detail. Additional advantages and modifications within the spirit and scope of the present invention will readily appear to those skilled in the art. Therefore, the present invention is not limited to the specific details and illustrative examples shown and described.

What is claimed is:

1. A mounting apparatus for a circuit board, comprising:
   a support plate comprising a plurality of catches, a locking hole defined in the support plate;
   a tray adapted for positioning the circuit board thereon, the tray defining a plurality of catch apertures and a through aperture, and the tray comprising a bent plate extending upwardly thereform; and
   a clip pivotally mounted to the tray, the clip comprising a first portion and a second portion, the first portion comprising a protrusion extending downwardly therefrom, the second portion comprising a resilient means elastically pressing on the bent plate of the tray;
   wherein the catches of the support plate slidably engage in the catch apertures of the tray, the protrusion of the clip extends through the through hole of the tray and engages in the locking hole of the support plate to secure the circuit board to the support plate, wherein the tray comprises a fixing means that has a horizontal part and a vertical part; a splint is bent at 180 degree from a distal end of the horizontal part of the fixing means; and a pivot hole is defined in the vertical part of the fixing means.

2. The mounting apparatus as claimed in claim 1, wherein the bent plate extends upwardly from a rear side of the tray.

3. The mounting apparatus as claimed in claim 1, wherein the tray comprises a tab stamped upwardly from a rear side of the tray and defines a pivot hole therein.

4. The mounting apparatus as claimed in claim 1, wherein each of the catch apertures comprises a guiding part and a locking part, each of the catches comprises a generally horizontal portion and a neck connecting between the horizontal portion and the support plate.

5. The mounting apparatus as claimed in claim 1, wherein the tray comprises a plurality of standoffs for supporting the circuit board.

6. The mounting apparatus as claimed in claim 1, wherein the protrusion protrudes downwardly from a distal end of the first portion, the resilient means is stamped outwardly from the second portion.

7. A mounting apparatus for a circuit board, comprising:
   a support plate defining a locking hole therein, and comprising a pair of guiding posts thereon;
   a tray adapted for positioning the circuit board thereon, and comprising a bent plate extending upwardly from the tray, the tray defining a through hole and a pair of guiding slots therein; and
   a clip pivotally mounted to the tray, and comprising a first portion and a second portion, the first portion comprising a protrusion extending downwardly therefrom, the second portion comprising a resilient means pressing the bent plate of the tray;
   wherein the guiding posts of the support plate slidably engage in the guiding slots of the tray, the protrusion of the clip extends through the through hole of the tray and engages in the locking hole of the support plate to secure the tray to the support plate, wherein the tray comprises a fixing means that has a horizontal part and a vertical part; a splint is bent at 180 degree from a distal end of the horizontal part of the fixing means; and a pivot hole is defined in the vertical part of the fixing means.

8. The mounting apparatus as claimed in claim 7, wherein the support plate comprises a plurality of catches which is stamped upwardly from the support plate.

9. The mounting apparatus as claimed in claim 8, wherein the tray comprises a plurality of catch apertures corresponding to the catches.

10. The mounting apparatus as claimed in claim 9, wherein each of the catch apertures comprises a guiding part and a locking part.

11. The mounting apparatus as claimed in claim 7, wherein the tray comprises a tab stamped upwardly from a rear side of the tray defining a pivot hole therein.

12. The mounting apparatus as claimed in claim 7, wherein the protrusion protrudes downwardly from a distal end of the first portion, the resilient means is stamped outwardly from the second portion.

13. A mounting apparatus assembly comprising:
   a fixed support plate;
   a tray detachably fastened to the support plate;
   a mother board detachably attached to the tray;
   an interengagement device formed on both said support plate and said tray which allows the tray to initially downwardly approach the support plate vertically, and successively move horizontally to a final locked position where said tray can no longer move vertically, wherein
   a clip pivotally mounted to the tray and defining a locking head extending through the tray and latched to the support plate for preventing backward horizontal movement of the tray relative to the support plate from the locked position when said clip is in a first pivotal position while allowing said backward horizontal movement when said clip is in a second pivotal position; wherein the tray includes a fixing means that has a vertical part to hold the clip in position, and a horizontal part to fasten to the tray; wherein the clip is constantly urged to be in the first pivotal position.

14. The assembly as claimed in claim 13, wherein said clip is located around an edge area of the tray.

* * * * *